United States Patent
Wang et al.

(10) Patent No.: US 10,069,236 B2
(45) Date of Patent: Sep. 4, 2018

(54) WATERPROOF STRUCTURE OF PAD, WATERPROOF PAD, AND METHOD FOR FORMING WATERPROOF STRUCTURE

(71) Applicant: Huawei Technologies Co., Ltd., Shenzhen (CN)

(72) Inventors: Jun Wang, Shenzhen (CN); Junlin Zou, Shenzhen (CN); Xiaowei Zou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 794 days.

(21) Appl. No.: 14/058,419

(22) Filed: Oct. 21, 2013

(65) Prior Publication Data

US 2014/0045372 A1 Feb. 13, 2014

Related U.S. Application Data

(63) Continuation of application No. PCT/CN2011/073011, filed on Apr. 19, 2011.

(51) Int. Cl.
*H01L 23/48* (2006.01)
*H01L 23/52* (2006.01)
(Continued)

(52) U.S. Cl.
CPC ......... *H01R 13/5213* (2013.01); *H01L 24/03* (2013.01); *H01L 24/05* (2013.01);
(Continued)

(58) Field of Classification Search
CPC ............... H01L 21/76807; H01L 23/48; H01L 23/5226; H01L 23/481; H01L 21/4857;
(Continued)

(56) References Cited

U.S. PATENT DOCUMENTS 6,303,977 B1 * 10/2001 Schroen .............. H01L 23/3185
257/620
2003/0218254 A1 11/2003 Kurimoto et al.
(Continued)

FOREIGN PATENT DOCUMENTS

CN 1407620 A 4/2003
CN 1519924 A 8/2004
(Continued)

OTHER PUBLICATIONS

Foreign Communication From A Counterpart Application, PCT Application No. PCT/CN2011/073011, English Translations for Search Report dated Jan. 5, 2012, 8 pages.
Foreign Communication From A Counterpart Application, PCT Application No. PCT/CN2011/073011, English Translations for dated Jan. 19, 2012, 5 pages.

*Primary Examiner* — S. V. Clark
(74) *Attorney, Agent, or Firm* — Huawei Technologies Co., Ltd.

(57) ABSTRACT

The present invention discloses a waterproof structure of a pad, a waterproof pad, and a method for forming the waterproof structure. The waterproof structure includes a first dielectric layer, having an annular hollowed-out recess along the periphery of the first dielectric layer and a metal annular zone formed in the annular hollowed-out recess, and a second dielectric layer, formed above the first dielectric layer and located under the pad and having multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts.

20 Claims, 9 Drawing Sheets

(51) Int. Cl.
*H01L 29/40* (2006.01)
*H01R 13/52* (2006.01)
*H01L 23/00* (2006.01)
*H01R 43/00* (2006.01)

(52) U.S. Cl.
CPC .. *H01R 43/005* (2013.01); *H01L 2224/02126* (2013.01); *H01L 2224/02166* (2013.01); *H01L 2224/05095* (2013.01); *H01L 2224/05096* (2013.01); *H01L 2224/05558* (2013.01); *H01L 2924/01023* (2013.01); *H01L 2924/01033* (2013.01); *H01L 2924/12041* (2013.01); *H01L 2924/14* (2013.01); *Y10T 29/49204* (2015.01)

(58) Field of Classification Search
CPC ........... H01L 21/486; H01L 2224/0558; H01L 2224/0401; H01L 2224/73216
USPC .................. 257/758, 784, 786; 438/106, 622
See application file for complete search history.

(56) References Cited

U.S. PATENT DOCUMENTS

| | | |
|---|---|---|
| 2004/0150070 A1 | 8/2004 | Okada et al. |
| 2005/0280149 A1* | 12/2005 | Tsutsui et al. ................. 257/734 |
| 2007/0080464 A1* | 4/2007 | Goebel ................... H01L 24/03 |
| | | 257/774 |
| 2008/0099855 A1 | 5/2008 | Nagai et al. |
| 2008/0258266 A1 | 10/2008 | Takemura et al. |
| 2010/0201000 A1* | 8/2010 | Antol .................... H01L 23/528 |
| | | 257/776 |
| 2011/0079873 A1 | 4/2011 | Oshima et al. |
| 2012/0211902 A1* | 8/2012 | Jeng ........................ H01L 24/05 |
| | | 257/784 |

FOREIGN PATENT DOCUMENTS

| | | |
|---|---|---|
| CN | 101213667 A | 7/2008 |
| CN | 101290912 A | 10/2008 |

* cited by examiner

700

| Forming a first dielectric layer, where the first dielectric layer has an annular hollowed-out recess along the periphery of the first dielectric layer and a metal annular zone formed in the annular hollowed-out recess | S710 |

↓

| Forming a second dielectric layer, where the second dielectric layer is formed above the first dielectric layer and located under a pad and has multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts | S720 |

FIG. 10

WATERPROOF STRUCTURE OF PAD, WATERPROOF PAD, AND METHOD FOR FORMING WATERPROOF STRUCTURE

CROSS-REFERENCE TO RELATED APPLICATIONS

This application is a continuation of International Application No. PCT/CN2011/073011, filed on Apr. 19, 2011, which is hereby incorporated by reference in its entirety.

FIELD OF THE INVENTION

The present invention relates to the semiconductor field, and in particular, to a waterproof structure of a pad, a waterproof pad, and a method for forming the waterproof structure in the semiconductor field.

BACKGROUND OF THE INVENTION

In recent years, with the fast advancement and development of the semiconductor industry, the semiconductor technology has already been applied in the design and manufacturing of the memory, central processing unit (CPU), liquid crystal display (LCD), light emitting diode (LED), and components or chip sets of other electronic products.

At present, in one aspect, to meet requirements for building a high-speed circuit, strict control needs to be performed on the parasitic capacitance of a pad. Currently, an available technology used to control the capacitance is to use a multilayer clearance area under the pad to reduce the coupling capacitance between the pad and the substrate. In another aspect, to increase exposure precision to increase the integration density of the circuit, an immersion lithography and immersion exposure technology has already been applied in the most advanced semiconductor manufacturing process. The immersion lithography and immersion exposure technology can effectively reduce the exposure size, so that high integration can be achieved.

However, because the whole exposure process needs to be completed in a liquid medium, moisture may be inevitably condensed on the exposed chip. If the condensed moisture cannot be controlled and prevented effectively, the performance of the chip may be greatly affected. Although the multilayer clearance area under the pad can be used to effectively control the parasitic capacitance of the pad, the large area of the multilayer clearance area may hinder the removal of moisture. Therefore, for the conventional low-capacitance pad structure, the chip performance may be affected when moisture cannot be controlled.

SUMMARY OF THE INVENTION

Embodiments of the present invention provide a waterproof structure of a pad, a waterproof pad, and a method for forming the waterproof structure, to control the removal of moisture in the manufacturing process of the pad, so that the performance of manufactured devices can be improved greatly.

In one aspect, an embodiment of the present invention provides a waterproof structure of a pad, where the waterproof structure includes a first dielectric layer, having an annular hollowed-out recess along the periphery of the first dielectric layer and a metal annular zone formed in the annular hollowed-out recess; and a second dielectric layer, formed above the first dielectric layer and located under the pad and having multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts.

In another aspect, an embodiment of the present invention provides a waterproof pad, where the waterproof pad includes a waterproof structure provided in an embodiment of the present invention and a pad formed above the waterproof structure, where the waterproof structure includes a first dielectric layer, having an annular hollowed-out recess along the periphery of the first dielectric layer and a metal annular zone formed in the annular hollowed-out recess; and a second dielectric layer, formed above the first dielectric layer and located under the pad and having multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts.

In still another aspect, an embodiment of the present invention provides a method for forming a waterproof structure of a pad, where the method includes forming a first dielectric layer, where the first dielectric layer has an annular hollowed-out recess along the periphery of the first dielectric layer and a metal annular zone formed in the annular hollowed-out recess; and forming a second dielectric layer, where the second dielectric layer is formed above the first dielectric layer and located under the pad and has multiple first through-holes along the periphery of the second dielectric layer and multiple metal posts formed in the multiple first through-holes, where the multiple first through-holes form a hollow annular through-hole chain, and the metal annular zone maintains an electrical connection with the multiple metal posts.

Based on the above technical solutions, by using the waterproof structure of the pad, the waterproof pad, and the method for forming the waterproof structure provided in embodiments of the present invention, an annular hollowed-out recess and multiple through-holes forming a hollow annular through-hole chain are arranged in the waterproof structure. In this way, moisture produced in the manufacturing process of the pad can be removed out of the pad from the hollowed-out recess and multiple through-holes or retained in the waterproof structure. Therefore, the removal of moisture can be controlled in the manufacturing process of the pad, so as to greatly improve the performance of manufactured devices.

BRIEF DESCRIPTION OF THE DRAWINGS

In order to make the technical solutions in embodiments of the present invention clearer, the accompanying drawings for illustrating the embodiments of the present invention are briefly described hereunder. The accompanying drawings illustrate only some embodiments of the present invention, and persons of ordinary skill in the art can derive other drawings from such accompanying drawings without any creative efforts.

FIG. 10 is a schematic flowchart of a method for forming a waterproof structure according to an embodiment of the present invention.

DETAILED DESCRIPTION OF THE EMBODIMENTS

The technical solutions in the embodiments of the present invention are hereinafter described clearly and completely with reference to the accompanying drawings of the embodiments of the present invention. The embodiments to be described are only some rather than all embodiments of the present invention. On the basis of the embodiments of the present invention, all other embodiments derived by persons of ordinary skill in the art without any creative effort shall fall within the protection scope of the present invention.

Figure 1A:
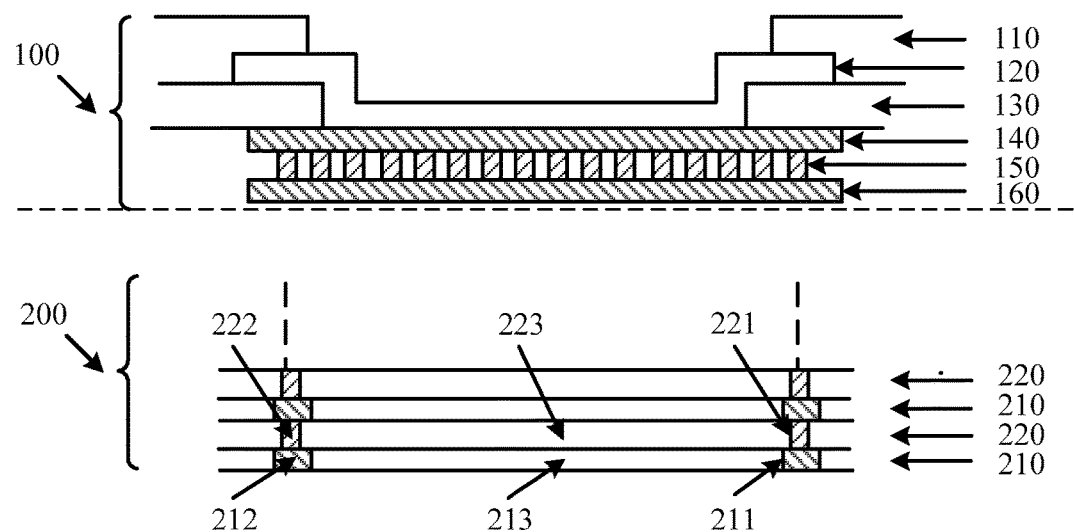
FIG. 1A and FIG. 1B are a schematic cross-section diagram and a planform of a waterproof structure according to an embodiment of the present invention.
Figure 1B:
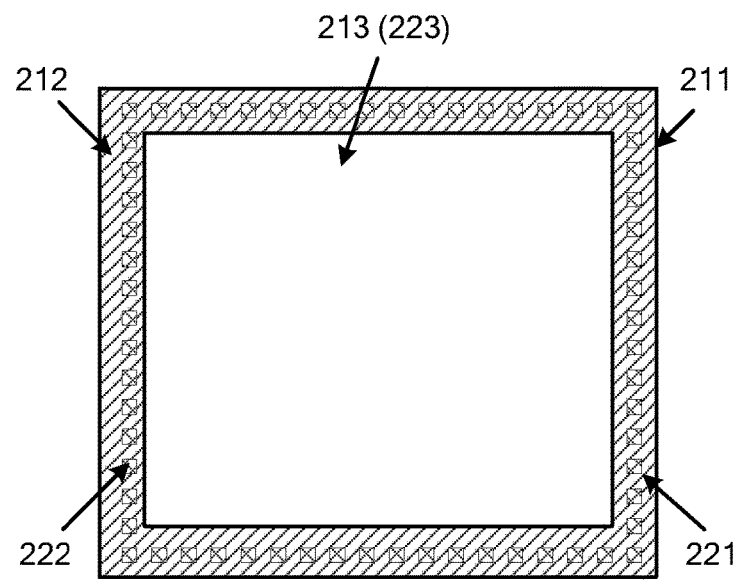

FIG. 1A and FIG. 1B are a schematic cross-section diagram and a planform of a waterproof structure 200 according to an embodiment of the present invention. As shown in FIG. 1A, a pad 100 may include a passivation layer 110, a pad metal layer 120, a passivation layer 130, a top metal layer 140, a through-hole layer 150, and a secondary top metal layer 160. Generally, the top metal layer 140 is represented by a symbol $M_{top}$, the through-hole layer 150 is represented by a symbol $V_{top}$, and the secondary top metal layer 160 is represented by a symbol $M_{top-1}$.

It should be understood that the embodiment of the present invention describes the waterproof structure provided in the embodiment of the present invention only by taking an ordinary pad structure for an example, and the pad structure should not impose any limitation on the present invention. According to design and application requirements and other requirements, a pad may have other structures. To achieve high speed and high integration of a semiconductor integrated circuit, all the pads can apply the waterproof structure provided in the embodiment of the present invention.

As shown in FIG. 1A and FIG. 1B, the waterproof structure 200 provided in the embodiment of the present invention includes at least one first dielectric layer 210 and at least one second dielectric layer 220. The first dielectric layer 210 has a hollow annular hollowed-out recess 211 along the periphery of the first dielectric layer 210, a metal annular zone 212 formed in the annular hollowed-out recess 211, and a medium 213 around the metal annular zone 212. The second dielectric layer 220 is formed above the first dielectric layer 210 and located under a pad 100, and has multiple first through-holes 221 along the periphery of the second dielectric layer 220, multiple metal posts 222 formed in the multiple first through-holes 221, and a medium 223 around the multiple metal posts 222, where the multiple first through-holes 221 form a hollow annular through-hole chain, and the metal annular zone 212 of the first dielectric layer 210 maintains an electrical connection with the multiple metal posts 222 of the second dielectric layer 220.

Specifically, for example, the hollow annular hollowed-out recess 211 is formed at the periphery of the medium 213 through photoetching and etching, so that moisture produced in a manufacturing process can be removed out of the pad from the annular hollowed-out recess 211. Then, the metal annular zone 212 is formed in the annular hollowed-out recess 211 to fill the annular hollowed-out recess 211, and the first dielectric layer 210 is formed. Similarly, multiple first through-holes 221 may be first formed at the periphery of the medium 223, and the multiple first through-holes 221 form a hollow annular through-hole chain. In this way, moisture produced in the manufacturing process can be removed out of the pad from the multiple first through-holes 221. Then, multiple metal posts 222 can be formed in the multiple first through-holes 221 to fill the multiple first through-holes 221, and the second dielectric layer 220 is formed.

Because the first dielectric layer forms a hollowed-out recess in the manufacturing process, moisture produced by a technology such as an immersion lithography and immersion exposure technology can be removed from the hollowed-out recess. In addition, the hollowed-out recess is formed in an annular shape at the periphery of the first dielectric layer, which can maximally facilitate the removal of moisture and prevent residual moisture from affecting other peripheral devices. Similarly, the second dielectric layer forms multiple through-holes in the manufacturing process, and the multiple through-holes also facilitate the removal of moisture and prevent residual moisture from affecting other peripheral devices.

Furthermore, the hollowed-out recess forms a hollow annular hollowed-out recess, and the multiple through-holes form a hollow annular through-hole chain, thereby avoiding the destroying of dielectric constants of the dielectric layer, effectively reducing parasitic capacitance, realizing a low-capacitance pad, and meeting a high-speed requirement of a circuit.

For the waterproof structure 200 of the pad provided in the embodiment of the present invention, a hollow annular hollowed-out recess 211 and multiple first through-holes 221 forming a hollow annular through-hole chain are arranged in the waterproof structure 200. In this way, moisture produced in the manufacturing process can be removed out of the pad from the annular hollowed-out recess 211 and multiple first through-holes 221 before the metal annular zone 212 is formed in the annular hollowed-out recess 211 and the multiple metal posts 222 are formed in the multiple first through-holes 221, or moisture produced in the manufacturing process is retained in the waterproof structure 200 after the metal annular zone 212 is formed in the annular hollowed-out recess 211 and the multiple metal posts 222 are formed in the multiple first through-holes 221. Therefore, the removal of moisture can be controlled in the manufacturing process, and meanwhile the parasitic capacitance of the pad can be controlled effectively, so as to greatly improve the performance of a manufactured device.

It should be understood that although FIG. 1A and FIG. 1B illustrate the waterproof structures of two first dielectric layers and two second dielectric layers, the waterproof structures of the present invention are not limited thereto. According to an actual requirement, the waterproof structure provided in the embodiment of the present invention may have only one first dielectric layer and one second dielectric layer, or have multiple first dielectric layers and multiple second dielectric layers. The quantity of the first dielectric layers may or may not be equal to that of the second dielectric layers.

In the embodiment of the present invention, multiple first through-holes 221 of the second dielectric layer 220 are located above the annular hollowed-out recess 211 of the first dielectric layer 210. That is, on a plane in parallel with the first dielectric layer 210 or the second dielectric layer 220, the coverage of the annular through-hole chain is the same as or slightly smaller than that of the annular hollowed-out recess 211. In addition, the coverage of the annular hollowed-out recess 211 is the same as or slightly smaller than that of a pad above thereof. Optionally, as shown in FIG. 1B, multiple metal posts 222 contact the metal annular zone 212 directly, and are covered by the metal annular zone 212.

Figure 2A:
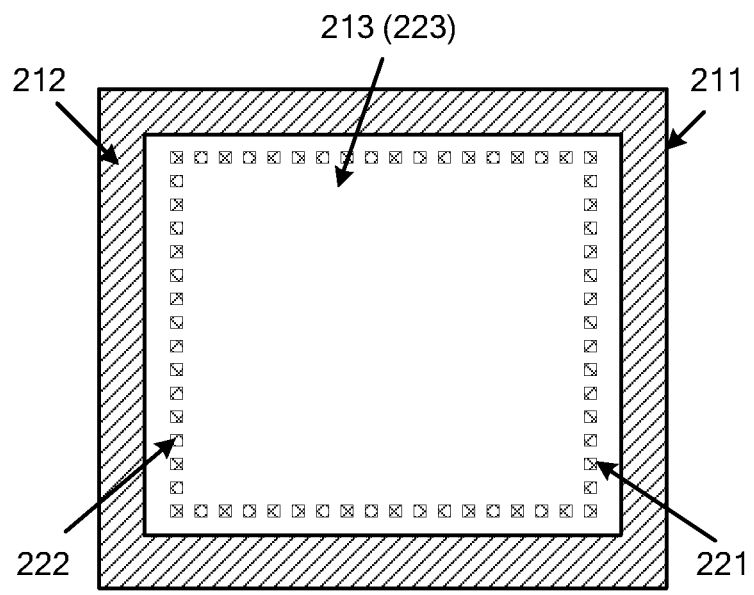
FIG. 2A and FIG. 2B are a schematic diagram of a location relationship between an annular hollowed-out recess and an annular through-hole chain of a waterproof structure according to an embodiment of the present invention.

Optionally, on a plane in parallel with the first dielectric layer 210 or the second dielectric layer 220, the coverage of the annular through-hole chain does not exceed that of the annular hollowed-out recess 211. That is, in the planform of the waterproof structure 200 shown in FIG. 2A, the annular through-hole chain 221 or the multiple metal posts 222 are located in the metal annular zone 212 or the annular hollowed-out recess 211, or are covered by the metal annular zone 212 or the annular hollowed-out recess 211.

Figure 2B:
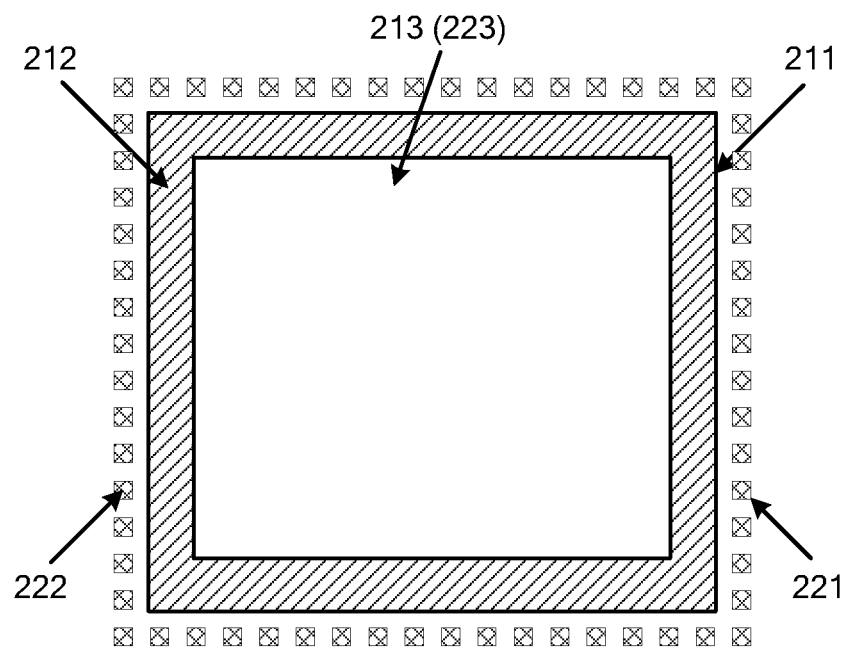

As shown in FIG. 2B, the annular through-hole chain or multiple metal posts 222 may also be located outside the metal annular zone 212 or the annular hollowed-out recess 211, and electrical connections between the metal annular zone 212 and the multiple metal posts 222 may be maintained by using other conductors.

In the structure shown in FIG. 1B, multiple metal posts 222 keep in electrical contact with the metal annular zone 212 directly, and thus an annular barrier structure can be formed. Therefore, even after the metal annular zone 212 is formed in the annular hollowed-out recess 211 and the multiple metal posts 222 are formed in the multiple first through-holes 221, in the manufacturing process, a little moisture is still left in a clearance area. However, the annular barrier structure may prevent the performance of peripheral circuits from being affected by the removal of residual moisture. That is, by using the waterproof structure provided in the embodiment of the present invention, the moisture can be removed in the manufacturing process, and the residual moisture can be controlled in the waterproof structure after the manufacturing process is completed, thereby preventing the removal of the moisture from affecting the performance of other devices.

Figure 3:
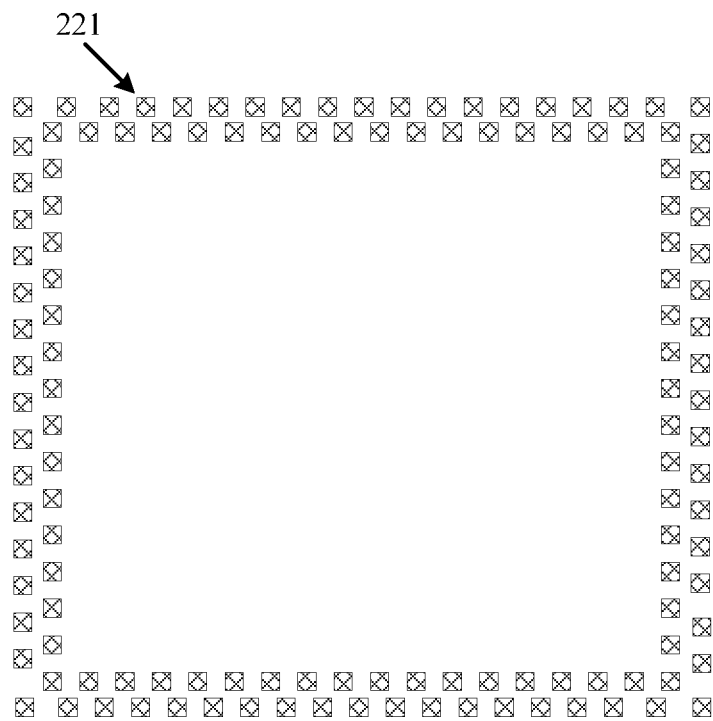
FIG. 3 is a schematic distribution diagram of an annular through-hole chain of a waterproof structure according to an embodiment of the present invention.

To further enhance the performance of the annular barrier structure, multiple first through-holes 221 can form an interleaved annular array, as shown in FIG. 3, that is, the multiple first through-holes 221 form an annular through-hole chain array that may have multiple annular through-hole chains. Optionally, the multiple first through-holes 221 are evenly distributed at the second dielectric layer 220. It should be understood that, as shown in FIG. 3, the annular through-hole chain array includes two annular through-hole chains. However, the embodiment of the present invention is not limited thereto, and the annular through-hole chain array provided in the embodiment of the present invention may include more annular through-hole chains. In addition, the shapes of the two annular through-hole chains shown in FIG. 3 are the same, which is exemplary only. The shapes of the two annular through-hole chains may also be different. For example, an interleaved array may be formed at one side or two sides of an internal annular through-hole chain only.

Figure 4A:
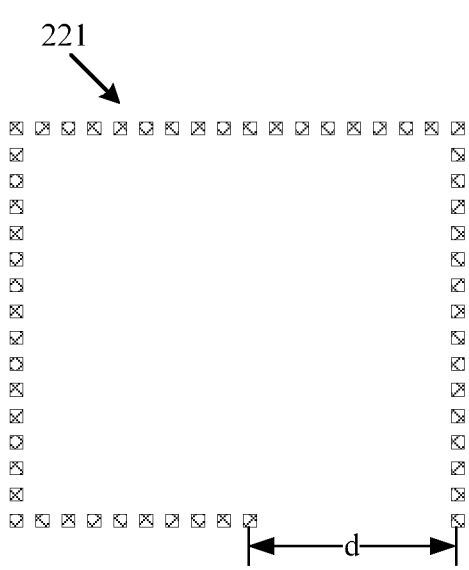
FIG. 4A and FIG. 4B are another schematic distribution diagram of an annular through-hole chain of a waterproof structure according to an embodiment of the present invention.
Figure 4B:
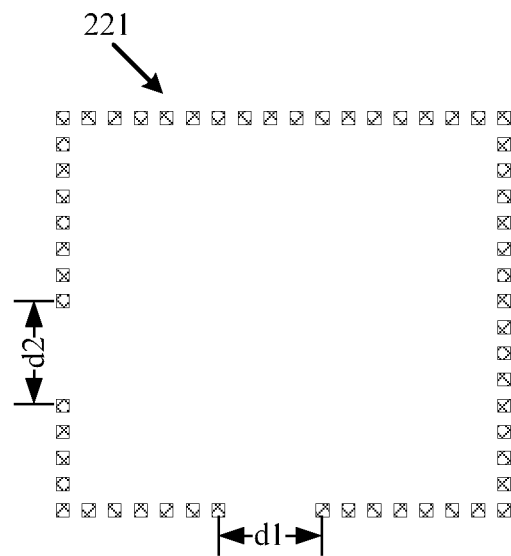

FIG. 4A and FIG. 4B are another schematic distribution diagram of an annular through-hole chain of the waterproof structure 200 provided in the embodiment of the present invention. As shown in FIG. 4A, the annular through-hole chain formed by multiple first through-holes 221 is semi-closed. Optionally, the length of the unclosed part of the annular through-hole chain is smaller than one fifth of the perimeter of the annular through-hole chain. That is, it is assumed that the length of the unclosed part of the annular through-hole chain in FIG. 4A is d and the perimeter of the annular through-hole chain is l, $d/l<20\%$.

The unclosed part of the annular through-hole chain may be continuous or discontinuous, as shown in FIG. 4B. For example, the total length of the unclosed part of the annular through-hole chain is smaller than one fifth of the perimeter of the annular through-hole chain, that is, $(d1+d2)/l<20\%$. Optionally, the length of the unclosed part of the annular through-hole chain is smaller than 10% or 5% of the perimeter of the annular through-hole chain. Optionally, multiple first through-holes 221 form a fully closed annular through-hole chain.

Figure 5A:
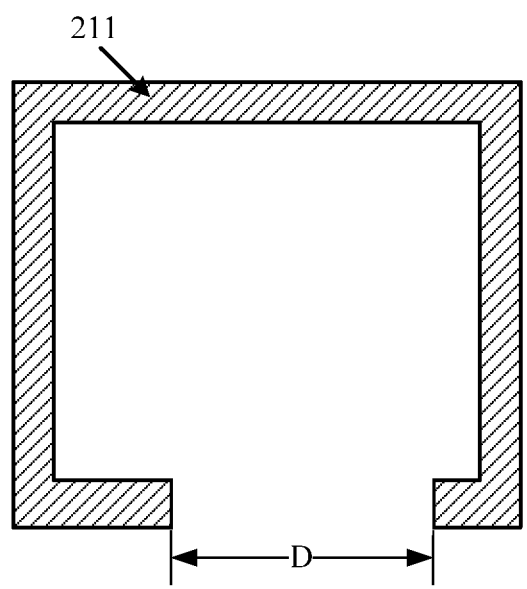
FIG. 5A and FIG. 5B are a schematic distribution diagram of an annular hollowed-out recess of a waterproof structure according to an embodiment of the present invention.
Figure 5B:
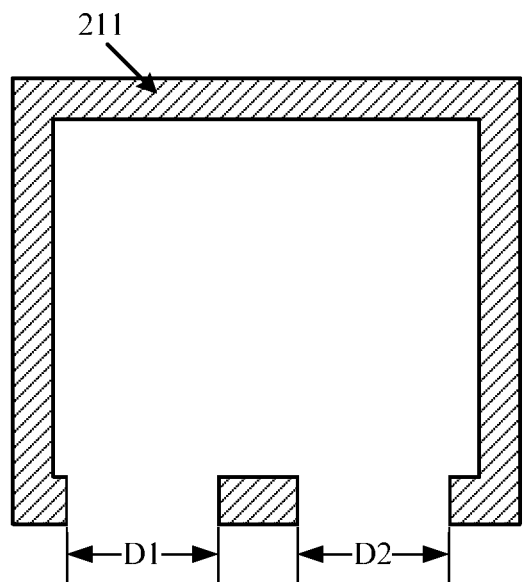

Similarly, as shown in FIG. 5A and FIG. 5B, the annular hollowed-out recess in the first dielectric layer may be fully closed or semi-closed, and the unclosed part of the annular hollowed-out recess may be continuous or discontinuous. Optionally, the length of the unclosed part of the annular hollowed-out recess is smaller than 20%, 10%, or 5% of the perimeter of the annular hollowed-out recess. For example, the length D of the unclosed part of the annular hollowed-out recess is smaller than 20% of the perimeter L of the annular hollowed-out recess, that is, $D/L<20\%$. In FIG. 5B, the total length (D1+D2) of the unclosed part of the annular hollowed-out recess is smaller than 20% of the perimeter L of the annular hollowed-out recess, that is, $(D1+D2)/L<20\%$.

Figure 6A:
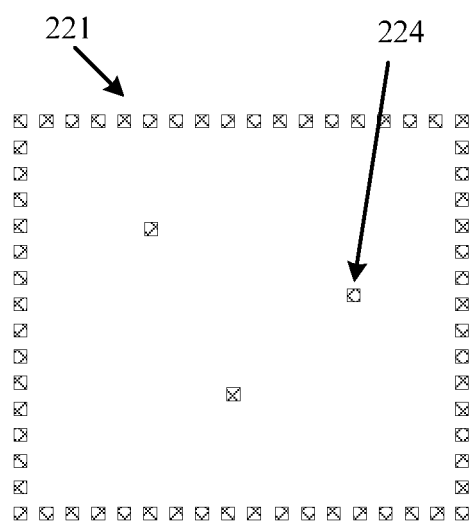
FIG. 6A and FIG. 6B are still another schematic distribution diagram of an annular through-hole chain and an annular hollowed-out recess of a waterproof structure according to an embodiment of the present invention.
Figure 6B:
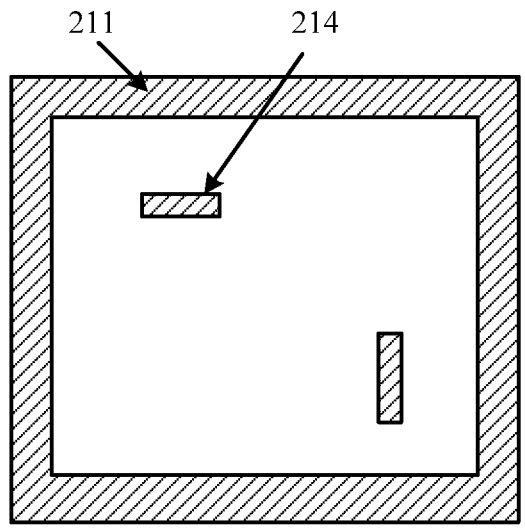

In the embodiment of the present invention, the annular through-hole chain formed by the multiple first through-holes is hollow, that is, in the annular through-hole chain, no through-hole exists, or only a few through-holes are scattered. As shown in FIG. 6A, the second dielectric layer 220 may further include second through-holes 224 scattered in the middle of the second dielectric layer 220. The second through-holes 224 facilitate the removal of moisture in the middle of the dielectric layer. Similarly, as shown in FIG. 6B, the first dielectric layer 210 may also include hollowed-out recesses 214 scattered in the middle of the first dielectric layer 210. The hollowed-out recesses 214 facilitate the removal of moisture in the middle of the first dielectric layer.

It should be understood that only a few second through-holes can be scattered in the middle of the second dielectric layer and only a few hollowed-out recesses can be scattered in the middle of the first dielectric layer. If there are too many second through-holes or too many hollowed-out recesses, for example, the number of second through-holes is 10% or 20% of the number of first through-holes, or the length of a hollowed-out recess is 10% or 20% of the perimeter of the annular hollowed-out recess, relatively large longitudinal capacitance may be caused. As a result, the high-speed requirements of semiconductor integrated circuits cannot be met.

In the above embodiment of the present invention, the shown annular hollowed-out recess and annular through-hole chain are both in a rectangular shape. It should be understood that the rectangular shape is exemplary only and should not impose any limitation on the embodiment of the present invention. The annular hollowed-out recess or the annular through-hole chain may be in polygonal, circular, oval, or other irregular shapes. The annular hollowed-out recess and the annular through-hole chain may or may not be in the same shape. Optionally, the annular hollowed-out recess and the annular through-hole chain are in the same shape and are both in a polygonal shape. It should also be understood that the first through-hole or the second through-hole may be in a quadrangular shape or in other polygonal shapes or in a circular shape or in other shapes. The cross-sectional shape of the annular hollowed-out recess or the hollowed-out recess may also be quadrangular, polygonal, or other shapes. Any equivalent modification or replacement made under the present invention should fall within the protection scope of the present invention.

The following specifically describes a waterproof structure 300 and a waterproof structure 400 provided in exemplary embodiments of the present invention.

Figure 7A:
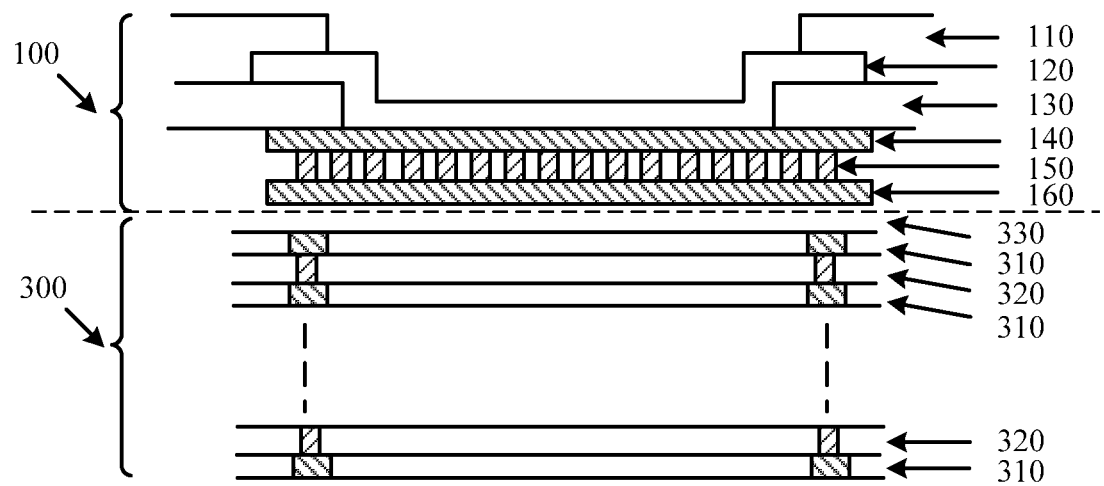
FIG. 7A and FIG. 7B are a schematic cross-section diagram and a planform of a waterproof structure according to another embodiment of the present invention.
Figure 7B:
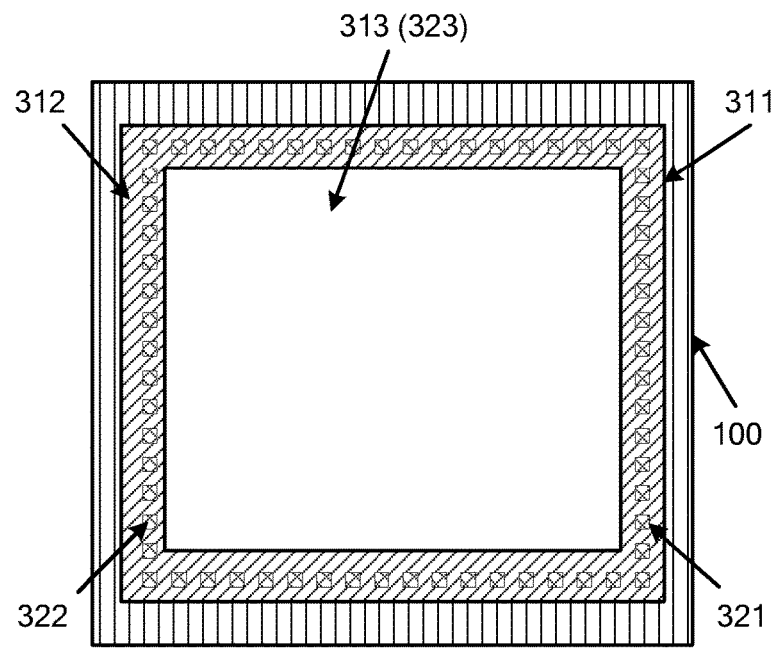

FIG. 7A and FIG. 7B are a schematic cross-section diagram and a planform of the waterproof structure 300 according to another embodiment of the present invention. As shown in FIG. 7A, the waterproof structure 300 includes multiple first dielectric layers 310 and multiple second dielectric layers 320, where the quantity of the first dielectric layers 310 is one more than the quantity of the second dielectric layers 320. The waterproof structure 300 further includes a dielectric layer 330 that is immediately under a pad 100, where the dielectric layer 330 is immediately above the first dielectric layer 310. In addition, the first dielectric layers 310 and the second dielectric layers 320 are alternatively formed under the dielectric layer 330. Optionally, in each of the first dielectric layers 310, the area surrounded by an annular hollowed-out recess 311 is smaller than the area of the pad 100.

A first dielectric layer 310 includes a hollow annular hollowed-out recess 311 along the periphery of the first dielectric layer 310, a metal annular zone 312 formed in the annular hollowed-out recess 311, and a medium 313 around the metal annular zone 312. A second dielectric layer 320 includes multiple first through-holes 321 along the periphery of the second dielectric layer 320, multiple metal posts 322 formed in the multiple first through-holes 321, and a medium 323 around the multiple metal posts 322, where the multiple first through-holes 321 form a hollow annular through-hole chain, and the metal annular zone 312 maintains an electrical connection with the multiple metal posts 322. Optionally, as shown in FIG. 7B, the multiple metal posts 322 contact the metal annular zone 312 directly, and are covered by the metal annular zone 312.

Although the waterproof structure 300 may introduce some longitudinal capacitance, the annular area of the waterproof structure 300 is relatively small, so that the capacitance value of parasitic capacitance is relatively small. In addition, the waterproof structure 300 has an advantage of saving a layout area.

Figure 8A:
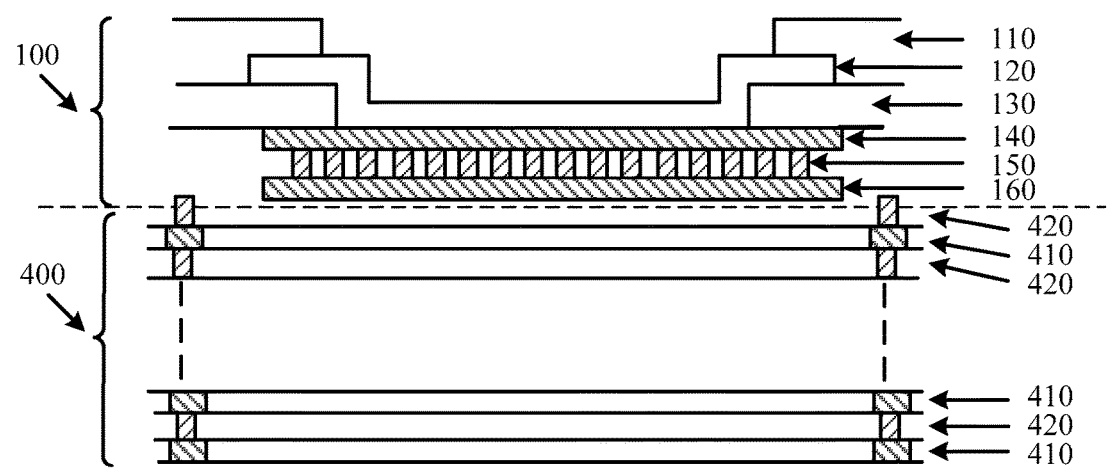
FIG. 8A and FIG. 8B are a schematic cross-section diagram and a planform of a waterproof structure according to still another embodiment of the present invention.
Figure 8B:
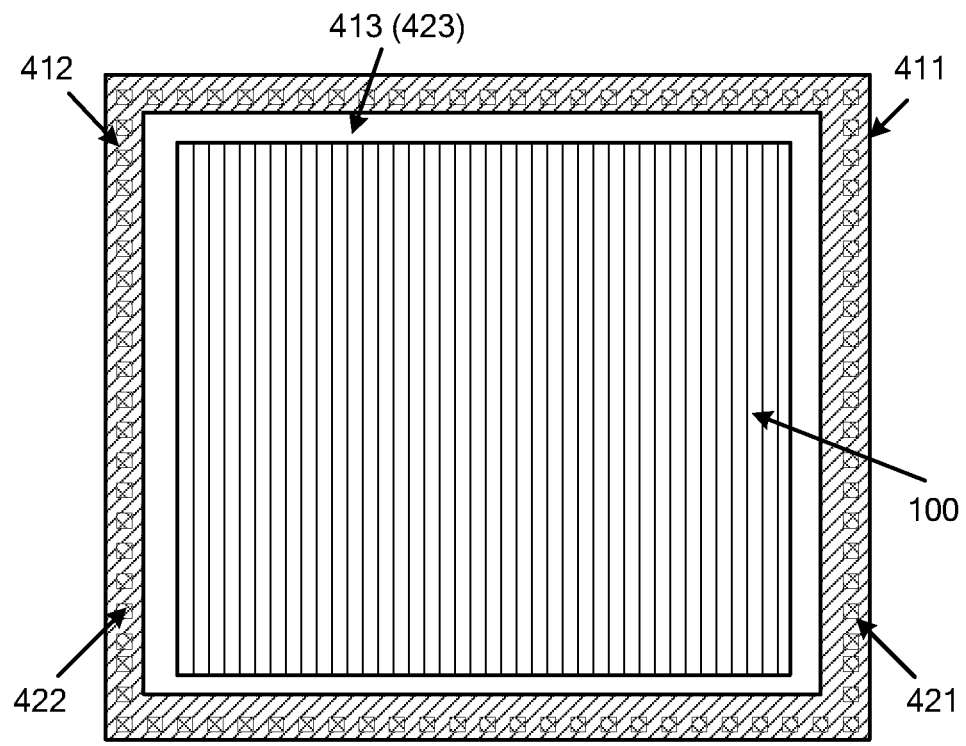

FIG. 8A and FIG. 8B are a schematic cross-section diagram and a planform of a waterproof structure 400 according to still another embodiment of the present invention. As shown in FIG. 8A, the waterproof structure 400 includes first dielectric layers 410 and second dielectric layers 420 of the same quantity. A first dielectric layer 410 includes a hollow annular hollowed-out recess 411, a metal annular zone 412, and a medium 413. The second dielectric layer 420 includes multiple first through-holes 421, multiple metal posts 422, and a medium 423, where the multiple first through-holes 421 form a hollow annular through-hole chain and the metal annular zone 412 maintains an electrical connection with the multiple metal posts 422. Optionally, as shown in FIG. 8A, in the first dielectric layer 410, the area surrounded by the annular hollowed-out recess 411 is greater than the area of a pad 100. Optionally, as shown in FIG. 8B, multiple metal posts 422 contact the metal annular zone 412 directly, and are covered by the metal annular zone 412.

It should be understood that the pads 100 shown in FIG. 7A and FIG. 8A may have the same structure as the pad 100 shown in FIG. 1A. In addition, according to design and application requirements and other requirements, the pad 100 may also have other structures. For conciseness, details are not further described herein.

The waterproof structure 400 surrounds the external area of the pad, and therefore, the waterproof structure 400 may occupy a part of a layout area. However, the waterproof structure 400 may not introduce longitudinal capacitance, and the parasitic capacitance of the pad is the smallest.

In the waterproof structures 300 and 400 provided in the embodiment of the present invention, hollow annular hollowed-out recesses 311 and 411, and multiple first through-holes 321 and 421 forming hollow annular through-hole chains are arranged, so that moisture produced in a pad manufacturing process can be removed from the annular hollowed-out recesses 311 and 411 and the multiple first through-holes 321 and 421 or retained in the waterproof structures 300 and 400. In this way, the parasitic capacitance of the pad can be controlled effectively, and meanwhile the moisture in the pad manufacturing process can be removed out of the pad or be retained in the waterproof structures 300 and 400, thereby greatly improving the performance of manufactured devices.

Figure 9:
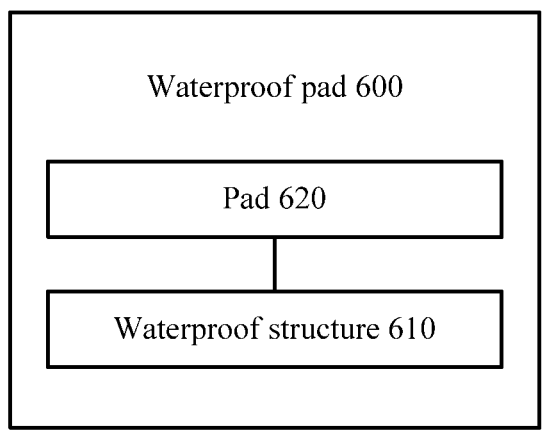
FIG. 9 is a schematic block diagram of a waterproof pad according to an embodiment of the present invention.

An embodiment of the present invention provides a waterproof pad. As shown in FIG. 9, the waterproof pad 600 includes a waterproof structure 610 provided in an embodiment of the present invention and a pad 620 formed above the waterproof structure 610. The waterproof structure 610 includes a first dielectric layer, having an annular hollowed-out recess along the periphery of the first dielectric layer and a metal annular zone formed in the annular hollowed-out recess; and a second dielectric layer, formed above the first dielectric layer and located under the pad and having multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts.

It should be understood that the waterproof structure 610 in the waterproof pad 600 provided in the embodiment of the present invention may correspond to the waterproof structures 200, 300, and 400 provided in the foregoing embodiments of the present invention. For conciseness, details are not described herein.

By using the waterproof pad 600 provided in the embodiment of the present invention, a hollow annular hollowed-out recess, and multiple through-holes forming a hollow annular through-hole chain are arranged in the waterproof structure, so that moisture produced in a manufacturing process can be removed from the hollowed-out recess and the through-holes or be retained in the waterproof structure. Therefore, the parasitic capacitance of the pad can be controlled effectively, and meanwhile the removal of moisture can be controlled in the manufacturing process, thereby greatly improving the performance of manufactured devices.

An embodiment of the present invention provides a method 700 for forming a waterproof structure. As shown in FIG. 10, the method 700 includes:

S710. Forming a first dielectric layer, where the first dielectric layer has an annular hollowed-out recess along the periphery of the first dielectric layer and a metal annular zone formed in the annular hollowed-out recess; and S720. Forming a second dielectric layer, where the second dielectric layer is formed above the first dielectric layer and located under a pad and has multiple first through-holes along the periphery of the second dielectric layer and multiple metal posts formed in the multiple first through-holes, where the multiple first through-holes form a hollow annular through-hole chain and the metal annular zone maintains an electrical connection with the multiple metal posts.

It should be understood that the above and other structures and/or features of each part of the waterproof structure in the method provided in the embodiment of the present invention are similar to corresponding structures and features in waterproof structures 200, 300, and 400 shown in FIG. 1 to FIG. 7. For conciseness, details are not described herein.

By using the method for forming the waterproof structure of the pad provided in the embodiment of the present invention, a hollow annular hollowed-out recess, and multiple through-holes forming a hollow annular through-hole chain are arranged in the waterproof structure, so that moisture produced in a manufacturing process can be removed from the hollowed-out recess and through-holes or be retained in the waterproof structure. Therefore, the parasitic capacitance of the pad can be controlled effectively, and meanwhile the removal of moisture can be controlled in the manufacturing process, thereby greatly improving the performance of manufactured devices.

Persons of ordinary skill in the art may be aware that exemplary units and method steps disclosed in each embodiment can be implemented by electronic hardware, computer software, or a combination of the electronic hardware and computer software. To clearly describe the interchangeability of the hardware and software, the components and steps of each embodiment have already been described in general in the specification according to functions. Whether the functions are executed in the form of hardware or software depends on specific applications and design constraints of the technical solutions. Those skilled in the art can use different methods to implement the described functions of each specific application, but it should not be deemed that such implementation falls outside the protection scope of the present invention.

It should be understood by those skilled in the art that, for the convenience and conciseness of description, reference may be made to corresponding processes provided in the method embodiments for the specific working processes of a system, the apparatus and units, and details are not further described.

It should be understood that in several embodiments provided by the application, the disclosed system, apparatus, and method may be implemented in other ways. For example, the above described apparatus embodiment is only exemplary. For example, the division of the units is only the division of logical functionality. In practical implementation, other division modes may be available, for example, multiple units or components may be combined or may be integrated in another system, or some features may be ignored or not be executed. In addition, the displayed or discussed mutual couplings or direct couplings or communication connections may be indirect couplings or communication connections between apparatuses or units through some interfaces, or may be implemented in electrical, mechanical, or other forms.

The units that are described as separate parts may or may not be physically separate. The components that are displayed as the units may or may not be physical units, that is, the components may be located at one place or distributed on multiple network elements. Some or all of the units may be selected according to an actual requirement to achieve the purposes of the technical solutions provided in embodiments of the present invention.

In addition, each functional unit in each embodiment of the present invention may be integrated into a processing unit, or each unit may physically exist independently, or two or more units are integrated into one unit. The integrated unit may be implemented in the form of hardware or may be implemented in the form of a software functional unit.

If the integrated unit is implemented in the form of a software functional unit and is sold or used as a separate product, the integrated unit may be stored in a computer readable storage medium. Based on such understanding, the essence of the technical solutions of the present invention, or the parts that make contribution to the prior art, or all or parts of the technical solutions may be embodied in the form of a software product. The computer software product is stored in a storage medium, and includes several instructions that enable a computer device (which may be a personal computer, a server, or a network device) to perform all or parts of the steps of the methods provided in the embodiments of the present invention. The preceding storage medium may be any medium that can store program codes, such as a universal serial bus (USB) disk, a removable hard disk, a read-only memory (ROM), a random access memory (RAM), a magnetic disk, or a compact disk ROM (CD-ROM).

The above description is merely about specific embodiments of the present invention, but not intended to limit the protection scope of the present invention. Any equivalent modification or replacement readily derived by those skilled in the art without departing from the technical scope disclosed by the present invention should fall within the protection scope of the present invention. Therefore, the protection scope of the present invention is subject to the appended claims.

What is claimed is:

1. A waterproof semiconductor device, the waterproof semiconductor device comprising:
    a pad;
    a first dielectric layer having an annular hollowed-out recess along a periphery of the first dielectric layer and a metal annular zone formed in the annular hollowed-out recess; and
    a second dielectric layer formed above the first dielectric layer and located under the pad and having multiple first through-holes along a periphery of the second dielectric layer and multiple metal posts formed in the multiple first through-holes, wherein the multiple first through-holes form a hollow annular through-hole chain and the metal annular zone maintains an electrical connection with the multiple metal posts.

2. The device according to claim 1, wherein coverage of the annular through-hole chain does not exceed coverage of the annular hollowed-out recess on a plane in parallel with the first dielectric layer or the second dielectric layer.

3. The device according to claim 2, wherein the multiple metal posts contact the metal annular zone and are covered by the metal annular zone.

4. The device according to claim 1, wherein the multiple first through-holes form an interleaved annular array.

5. The device according to claim 1, wherein the multiple first through-holes are evenly distributed in the second dielectric layer.

6. The device according to claim 1, wherein the annular through-hole chain is fully closed.

7. The device according to claim 1, wherein the annular through-hole chain is semi-closed and a length of an unclosed part of the annular through-hole chain is smaller than one fifth of a perimeter of the annular through-hole chain.

8. The device according to claim 1, wherein the annular hollowed-out recess is fully closed.

9. The device according to claim 1, wherein the annular hollowed-out recess is semi-closed and a length of an unclosed part of the annular hollowed-out recess is smaller than one fifth of a perimeter of the annular hollowed-out recess.

10. The device according to claim 1, wherein the annular hollowed-out recess and the annular through-hole chain are both in a polygonal shape.

11. The device according to claim 1, wherein the waterproof structure further comprises a dielectric layer that is under the pad and the first dielectric layer that is under the dielectric layer.

12. The device according to claim 11, wherein an area surrounded by the annular hollowed-out recess in the first dielectric layer is smaller than an area of the pad.

13. The device according to claim 1, wherein an area surrounded by the annular hollowed-out recess in the first dielectric layer is greater than an area of the pad.

14. The device according to claim 13, wherein the quantity of the first dielectric layers is equal to the quantity of second dielectric layers.

15. The device according to claim 1, wherein the first dielectric layer further comprises a hollowed-out recess scattered in the middle of the first dielectric layer.

16. The device according to claim 1, wherein the second dielectric layer further comprises a second through-hole scattered in the middle of the second dielectric layer.

17. A method of producing a device, comprising:
forming a first dielectric layer, wherein the first dielectric layer comprises a hollow annular hollowed-out recess along the periphery of the first dielectric layer, a metal annular zone formed in the annular hollowed-out recess, and a medium around the metal annular zone
forming a second dielectric layer above the first dielectric layer and under a pad comprising a plurality of first through-holes along the periphery of the second dielectric layer, wherein the plurality of first through-holes form a hollow annular through-hole chain, and the metal annular zone of the first dielectric layer maintains an electrical connection with the multiple metal posts of the second dielectric layer; and
removing moisture from the apparatus using the plurality of first through-holes; and
forming a plurality of metal posts in the plurality of first through-holes and a medium around the multiple metal posts.

18. The method of claim 17, wherein an area surrounded by the annular hollowed-out recess in the first dielectric layer is greater than an area of the pad.

19. The method of claim 18, further comprising fully closing the annular hollowed-out recess.

20. The method of claim 18, further comprising forming, on the first dielectric, a hollowed-out recess scattered in the middle of the first dielectric layer.

* * * * *